US006984461B2

(12) United States Patent
Son et al.

(10) Patent No.: US 6,984,461 B2
(45) Date of Patent: Jan. 10, 2006

(54) BLUE ELECTROLUMINESCENT POLYMER AND ORGANIC-ELECTROLUMINESCENT DEVICE USING THE SAME

(75) Inventors: Jhun-mo Son, Kyungki-do (KR); Sang-hoon Park, Kyungki-do (KR); Jeong-yeol Lee, Kyungki-do (KR); Woon-jung Beek, Kyungki-do (KR); Hisaya Sato, Tokyo (JP)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 10/465,825

(22) Filed: Jun. 20, 2003

(65) Prior Publication Data

US 2004/0072989 A1  Apr. 15, 2004

(30) Foreign Application Priority Data

Jun. 21, 2002   (KR) ......................... 2002-0034925
Jun. 10, 2003   (KR) ..................... 10-2003-0037135

(51) Int. Cl.
H05B 33/14    (2006.01)
C09K 11/06    (2006.01)
C08G 61/00    (2006.01)

(52) U.S. Cl. ................. 428/690; 428/917; 252/301.16; 257/40; 313/504; 313/506; 528/397; 528/403

(58) Field of Classification Search ................ 428/690, 428/917; 257/40; 252/301.16, 301.35; 313/504, 313/506; 528/394, 423, 397, 403
See application file for complete search history.

(56) References Cited

U.S. PATENT DOCUMENTS

| | | | | |
|---|---|---|---|---|
| 5,663,042 A | * | 9/1997 | Grieve et al. | 430/619 |
| 5,874,179 A | * | 2/1999 | Kreuder et al. | 428/690 |
| 6,403,239 B2 | * | 6/2002 | Chen et al. | 428/690 |

FOREIGN PATENT DOCUMENTS

| | | | |
|---|---|---|---|
| JP | 7-109449 | | 4/1995 |
| JP | 10-310606 | * | 11/1998 |
| JP | 2003-165829 | * | 6/2003 |

OTHER PUBLICATIONS

Tu et al., Synthesis and properties of PPP-based copolymers containing phenothiazine moiety, Synthetic Metals, 137 (2003), pp. 1117-1118.*
C.W. Tang, et al., "Organic Electroluminescent Diodes", American Institute of Physics, App. Phys. Lett. 51, vol. 12, Sep. 21, 1987, pp. 913-915.
J.H. Burroughes, et al. "Light-Emitting Diodes Based on Conjugated Polymers", NATURE, vol. 347, Oct. 11, 1990, pp. 541.
Olivier Stehpan, et al., "Blue Light Electroluminescent Devices Based on a Copolymer Derived from Fluorene and Carbazole", Elsevier Science, vol. 106, 1999, pp. 115-119.

* cited by examiner

Primary Examiner—Rena Dye
Assistant Examiner—C Thompson
(74) Attorney, Agent, or Firm—Stein, McEwen & Bui, LLP

(57) ABSTRACT

A blue electroluminescent polymer includes a phenoxazine unit in its polyarylene backbone, and a high-luminance, high-efficiency, stable-performance organic electroluminescent device has an organic layer that includes the blue electroluminescent polymer.

13 Claims, 5 Drawing Sheets

Formula (4)

Formula (5)

BLUE ELECTROLUMINESCENT POLYMER AND ORGANIC-ELECTROLUMINESCENT DEVICE USING THE SAME

CROSS-REFERENCE TO RELATED APPLICATIONS

This application claims the benefit of Korean Application Nos. 2002-34925 and 2003-37135, filed Jun. 21, 2002 and Jun. 10, 2003, respectively, in the Korean Intellectual Property Office, the disclosures of which are incorporated herein by reference.

BACKGROUND OF THE INVENTION

1. Field of the Invention

The present invention relates to a blue electroluminescent polymer and an organic-electroluminescent device using the same, and more particularly, to a blue electroluminescent polymer including a phenoxazine unit in a polyarylene backbone and an organic-electroluminescent device using the same that offers high luminance and efficiency.

2. Description of the Related Art

Since the report of a multi-layered organic-electroluminescent (EL) device, each layer having a specified function, by C. W Tang of EASTMAN KOKAK COMPANY, due to the advantages of lightweight, thinness, a wide range of colors, fast switching speed, and high luminescence at low driving voltage, many studies on organic-electroluminescent devices have been conducted over the last decade. As a result of the efforts, great improvements in the performance of multi-layered organic-electroluminescent devices have been accomplished in a short period of time: balanced charge injection due to multi-layered structures, color tunability and higher quantum efficiency by doping, etc. In addition, new electrodes made of an alloy are available for organic-EL devices.

Such organic-EL devices may be classified depending on the molecular weight of their materials and manufacturing processes: devices manufactured from low molecular weight compounds and device manufactured using large molecular weight compounds. Low molecular weight compounds may be layered by vacuum deposition and may be easily purified to a high degree. In addition, color pixels may be easily obtained in a low molecular weight device. Despite the advantages of low molecular weight organic-EL devices, there still remain further improvements for practical application, for example, in quantum efficiency and color purity, and a need to prevent crystallization of thin layers. Various studies on such EL displays using low molecular weight compounds have been actively undertaken, especially in Japan and the U.S.A. For example, IDEMITSU-KOSAN CO., LTD. of Japan first exhibited in 1997 a 10-inch full color organic-EL display using a color-changing medium. PIONEER CORPORATION of Japan presented a 5-inch passive matrix (PM) full color organic-EL display. Recently, PIONEER CORPORATION and MOTOROLA INC. have arrived at an agreement concerning the mass production of cellular phones with an organic-EL display, implying that low molecular weight EL displays will be commercially viable in the near future.

Research on EL devices using polymers has been accelerated since the Cambridge Group's report in 1990 on the ability of poly(1,4-phenylene vinylene)(PPV), π-conjugated polymer, to emit light when exposed to electricity. π-conjugated polymers have an alternating structure of single bonds (σ-bonds) and double bonds (π-bonds), where π-electrons are evenly distributed to be freely movable in the polymer chain. Accordingly, π-conjugated polymers have semiconducting properties and may emit light of a visible range corresponding to the HOMOLUMO energy bandgap, via proper molecular designing, when applied to an emissive layer of an EL device. Such a polymer may be formed easily as a thin layer in the manufacture of EL devices, by spin coating or printing, at low costs and has a high glass transition temperature that allows the thin layer effective mechanical properties. Thus, such polymer-based EL devices are expected to be more commercially competitive than low molecular weight EL devices in the near future.

However, blue EL devices using polymers have problems of low color purity, high driving voltage, and low efficiency. To address the problems of polymer-based EL devices, there have been active studies. As an example, copolymerization (U.S. Pat. No. 6,169,163) or blending (Synthetic Metal, Vol. 106, pp. 115–119, 1999) of a fluorene-containing polymer was suggested for improved EL properties. However, additional improvements still remain to be made.

SUMMARY OF THE INVENTION

An aspect of the present invention provides a blue electroluminescent (EL) polymer with improved emission properties and stability that includes a phenoxazine unit that has high charge mobility and able to emit blue light in its polyarylene backbone.

An aspect of the present invention provides an organic EL device with an organic layer made from the blue EL polymer.

In accordance with an aspect of the present invention, there is provided a blue EL polymer of represented by formula (1) below is synthesized:

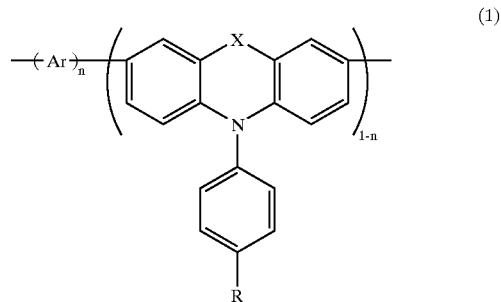

(1)

where Ar is a $C_{6-26}$ aromatic group or a $C_{4-20}$ heteroaromatic group including at least one heteroatom in the aromatic ring, where the aromatic group or the heteroaromatic group is unsubstituted or substituted with at least one of a $C_{1-12}$ alkyl group, a $C_{1-12}$ alkoxy group, and —N(R')(R") where R' and R" are independently a hydrogen atom or a $C_{1-12}$ alkyl group; X is one of O, $CH_2$, and S; R is selected from a group consisting of a hydrogen atom, a $C_{1-12}$ linear alkyl group, a $C_{1-12}$ branched alkyl group, a $C_{1-12}$ alkoxy group, a cyclic $C_{3-12}$ alkyl group, and a $C_{6-14}$ aromatic group which is unsubstituted or substituted with at least one of a $C_{1-12}$ alkyl group, a $C_{1-12}$ alkoxy group, and —N(R')(R") where R' and R" are independently a hydrogen atom or a $C_{1-12}$ alkyl group; and n is a real number ranging from 0.01 to 0.99.

In accordance with another aspect of the present invention, an organo-EL device comprises an organic layer between a pair of electrodes, the organic layer containing the above-mentioned blue EL polymer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

The above and other features and advantages of the present invention will become more apparent by describing in detail exemplary embodiments thereof with reference to the attached drawings in which.

DETAILED DESCRIPTION OF THE EMBODIMENTS

Figure 1A:
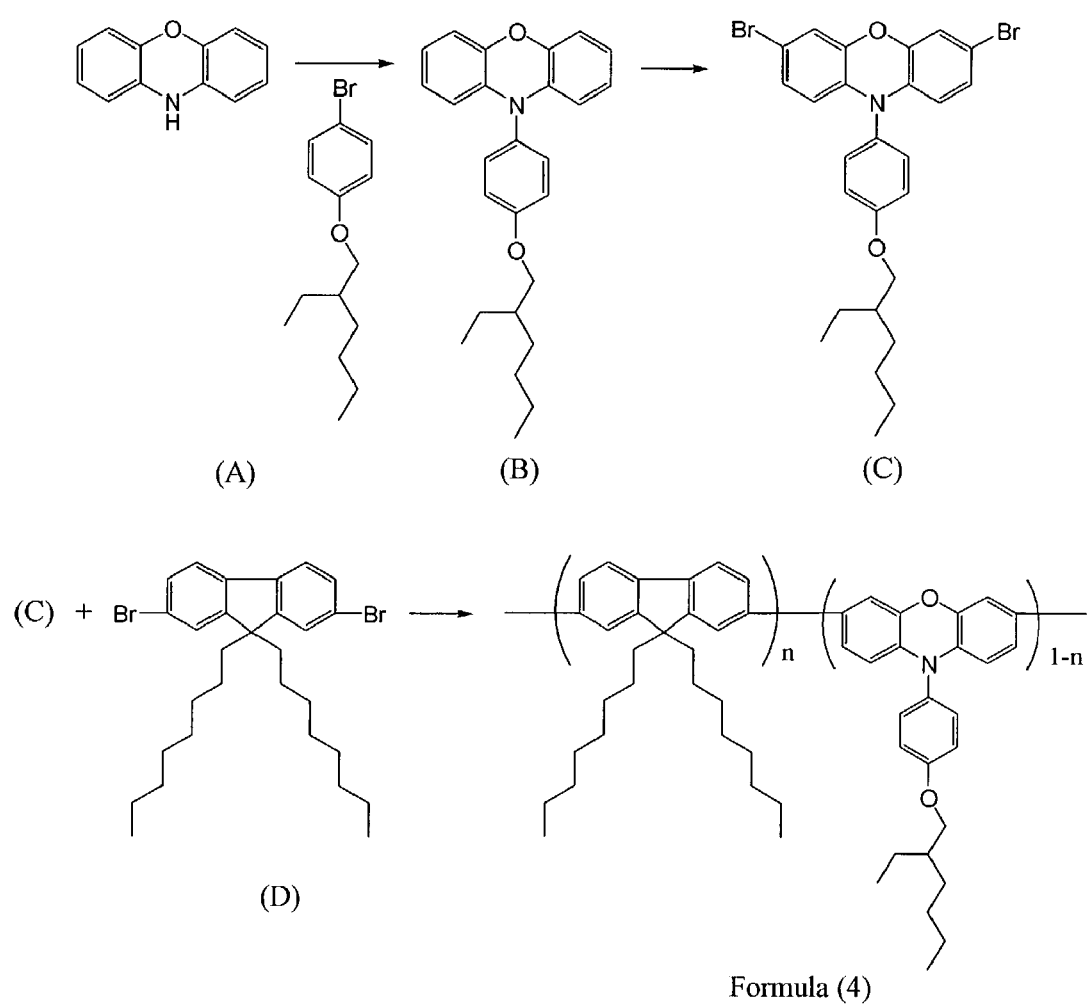
FIG. 1A is a reaction scheme illustrating the synthesis of poly(9,9-dioctylfluorene-cophenoxazine) of formula (4) according to the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

A blue electroluminescent (EL) polymer of formula (1) below according to an embodiment of the present invention includes a phenoxazine unit in a polyarylene backbone:

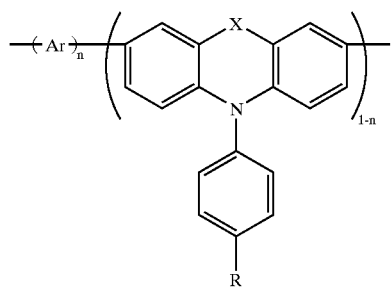

(1)

where Ar is a $C_{6-26}$ aromatic group or a $C_{4-20}$ heteroaromatic group including at least one heteroatom in the aromatic ring, where the aromatic group or the heteroaromatic group is unsubstituted or substituted with at least one of a $C_{1-12}$ alkyl group, a $C_{1-12}$ alkoxy group, and —N(R')(R") where R' and R" are independently a hydrogen atom or a $C_{1-12}$ alkyl group; X is one of O, $CH_2$, and S; R is selected from a group consisting of a hydrogen atom, a $C_{1-12}$ linear alkyl group, a $C_{1-12}$ branched alkyl group, a $C_{1-12}$ alkoxy group, a cyclic $C_{3-12}$ alkyl group, and a $C_{6-14}$ aromatic group which is unsubstituted or substituted with at least one of a $C_{1-12}$ alkyl group, a $C_{1-12}$ alkoxy group, and —N(R')(R") where R' and R" are independently a hydrogen atom or a $C_{1-12}$ alkyl group; and n is a real number ranging from 0.01 to 0.99.

According to an embodiment the present invention, phenoxazine monomers which have a high charge mobility and emit blue light are incorporated into the polyarylene backbone by copolymerization with arylene monomers to improve the blue EL property of a final polymer product.

Arylene (Ar) units composing the backbone of a blue EL polymer according to an embodiment of the present invention have a structure selected from the groups of formula (2) and (3) below, and, while not required, the arylene (Ar) units preferably have a fluorene structure.

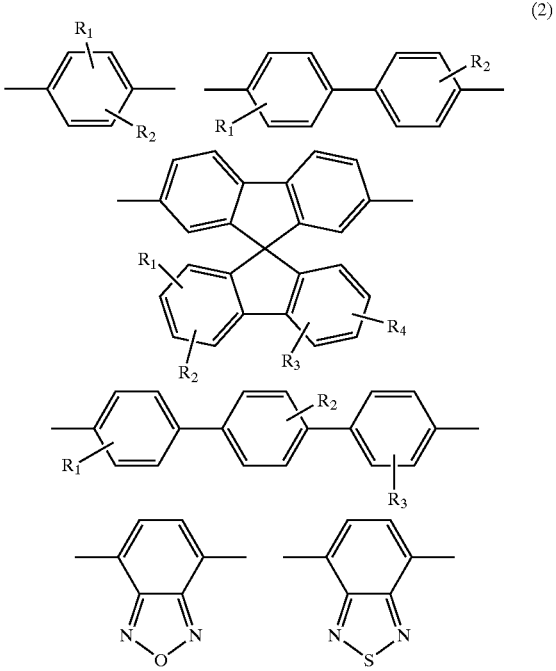

(2)

In formula (2) above, $R_1$, $R_2$, $R_3$, and $R_4$ are independently selected from the group consisting of a $C_{1-12}$ alkyl group, a $C_{1-12}$ alkoxy group, and —N(R')(R") where R' and R" are independently a hydrogen atom or a $C_{1-12}$ alkyl group.

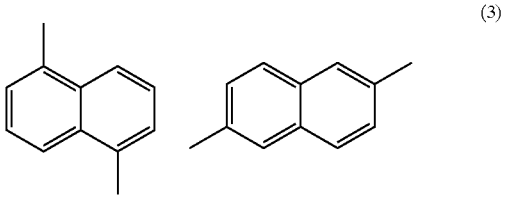

(3)

-continued

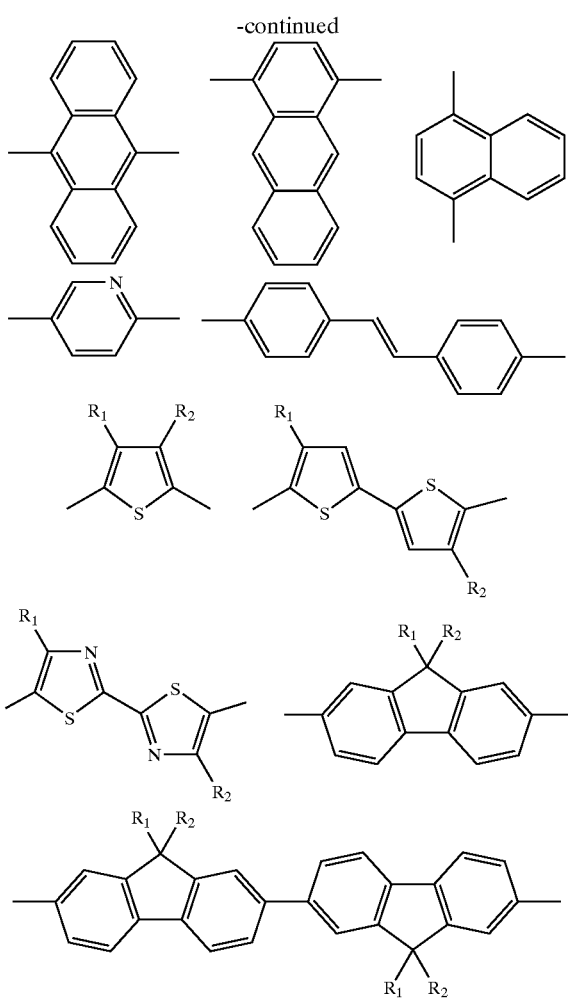

In formula (3) above, $R_1$, and $R_2$ are independently selected from a group consisting of a $C_{1-12}$ alkyl group, a $C_{1-12}$ alkoxy group, and —N(R')(R") where R' and R" are independently a hydrogen atom or a $C_{1-12}$ alkyl group.

A fluorene structure exhibits more fluorescence than other aromatic structures and greater chemical flexibility due to a soluble moiety at the 9–9' position that is highly likely to accept various substituents, including an alkyl group. Thus, the fluorene structure is preferable for the arylene unit.

Figure 1B:
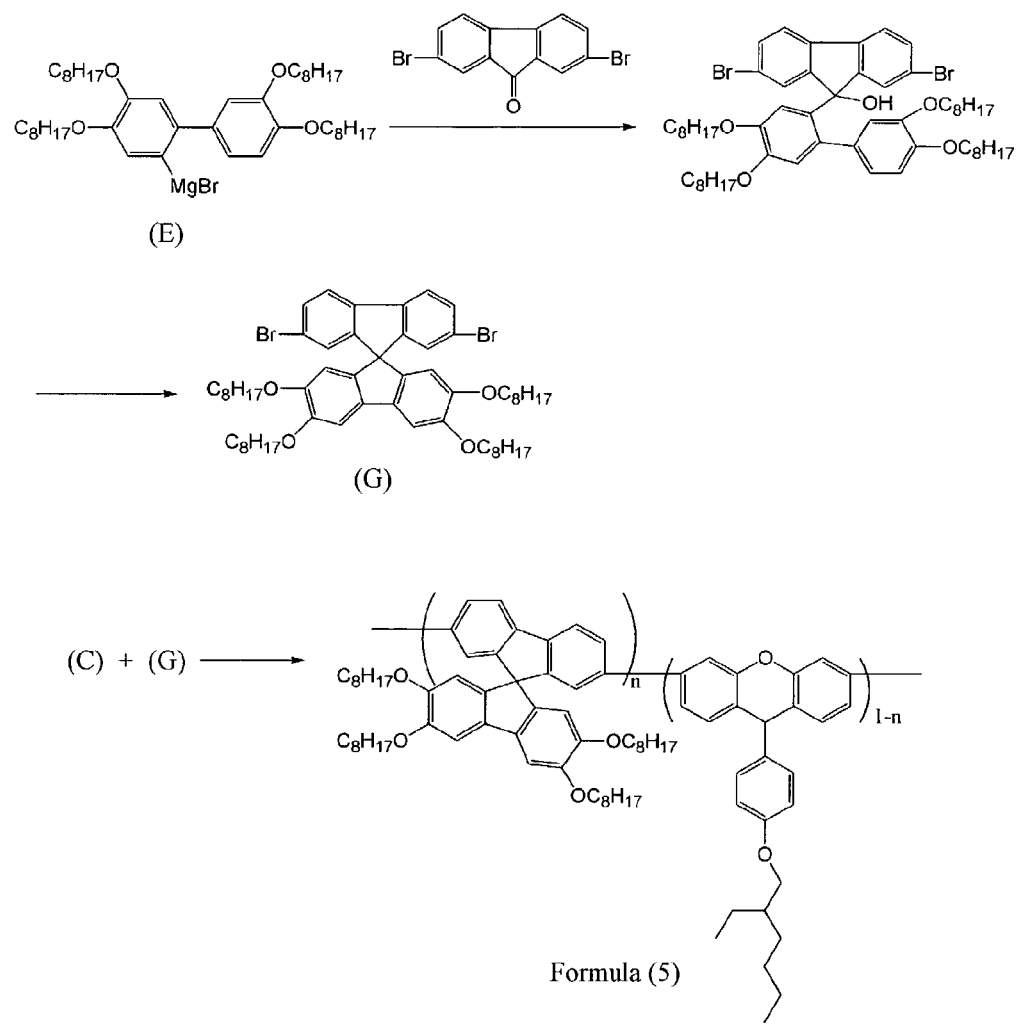
FIG. 1B is a reaction scheme illustrating the synthesis of poly(2',2',6',7'-tetraoctyloxyspirofluorene-co-phenoxazine) of formula (5) according to the present invention.
Figure 2:
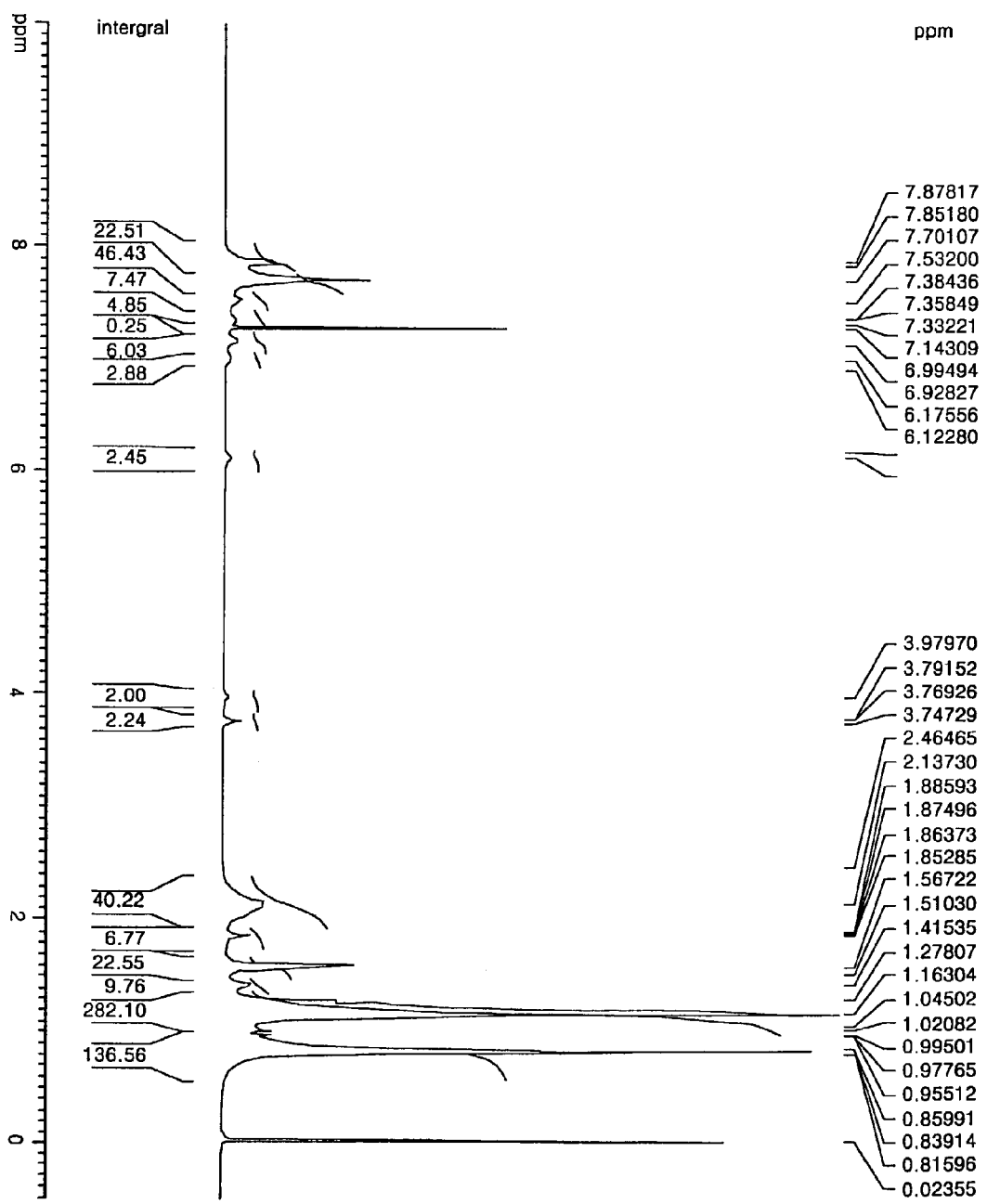
FIG. 2 is a $^1$H-NMR spectrum of PFP091 prepared in Comparative Example 1 according to the present invention.

FIGS. 1A and 1B illustrate reaction schemes illustrating the synthesis of blue EL polymers from different arylene (Ar) units, 9,9'-dioctylfluorene and 2',3',6',7'-tetraoctyloxyspirofluorene, respectively.

It is preferable, but not required, that a blue EL polymer according to the present invention has a weight average molecular weight of 10,000–200,000. The weight average molecular weight of the blue EL polymer affects thin film formation and the lifetime of an EL device manufactured from the polymer. If the blue EL polymer has a weight average molecular weight less than 10,000, crystallization is likely to occur in the manufacture and the driving of a device. On the other hand, it is impractical to obtain a blue EL polymer having a weight average molecular weight greater than 200,000 via Pd(O) or Ni(0)-mediated aryl coupling reaction.

A narrower molecular weight distribution (MWD) of an EL polymer is known to be advantageous in various aspects, especially for the longer lifetime of a device. The blue EL polymer according to the present invention has an MWD of 1.5–5.

It is preferable, but not required, that a blue EL polymer according to an embodiment of the present invention has formula (4) or (5) below:

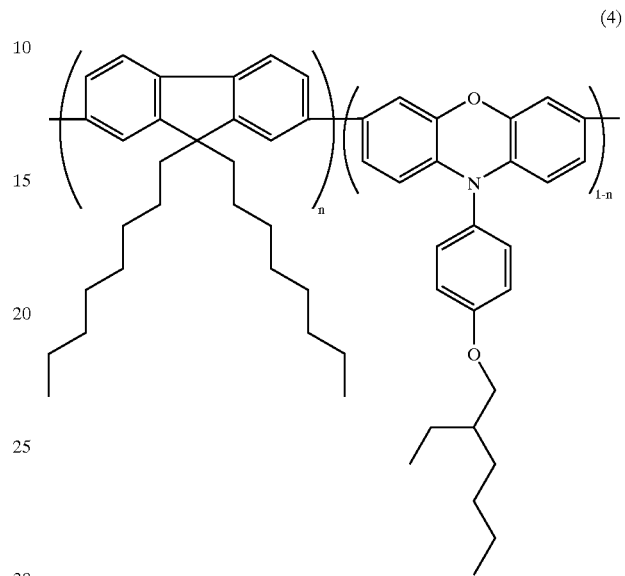

(4)

In formula (4), n is a real number ranging from 0.01 to 0.99. Preferably, the range is from 0.6 to 0.9.

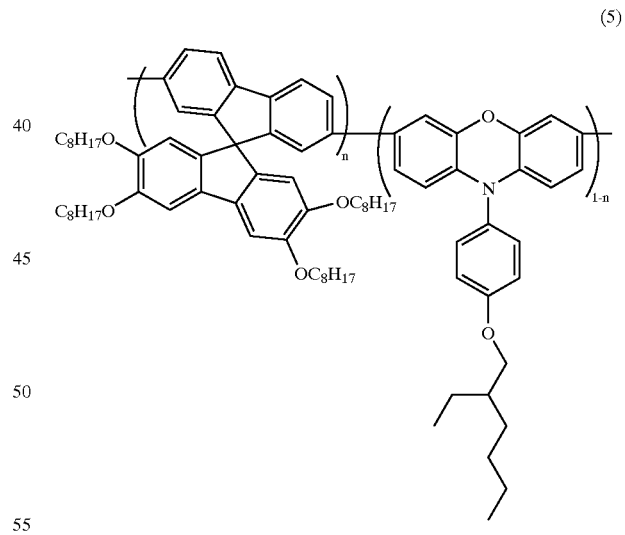

(5)

In formula (5) above, n is a real number ranging from 0.01 to 0.99. Preferably, the range is from 0.6 to 0.9.

Figure 6:
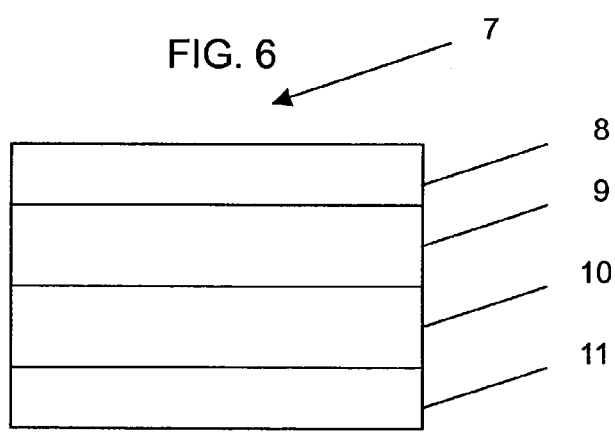
FIG. 6 is a block diagram illustrating (not to scale) an organo-electroluminescent device in accordance with an embodiment of the present invention.

An organo-electroluminescent device according to the present invention includes an organic layer, and in particular, an emissive layer, made from the above blue EL polymer. It is preferable that the organic layer has a thickness of 50–100 nm. Throughout the specification, the term "organic layer" embraces all organic compound layers, including an electron transporting layer, a hole transporting layer, etc., formed between a pair of electrodes of an organic EL device. As shown in FIG. 6 (see also FIG. 3), in a block diagram illustrating (not to scale) an organo-electroluminescent device 7 in accordance with an embodiment of the present invention, the organ-electroluminescent device 7 comprises an anode 8 and a cathode 10 having an organic layer 9 disposed therebetween. The organic layer 9 includes the above blue EL polymer. The cathode 10 is disposed on a substrate 11.

Exemplary structures of the organo-EL device according to the present invention include, but are not limited to, a stack of anode/emissive layer/cathode, a stack of anode/buffer layer/emissive layer/cathode, a stack of anode/hole transporting layer/emissive layer/cathode, a stack of anode/buffer layer/hole transporting layer/emissive layer/cathode, a stack of anode/buffer layer/hole transporting layer/emissive layer/electron transporting layer/cathode, and a stack of anode/buffer layer/hole transporting layer/emissive layer/hole blocking layer/cathode.

Any material commonly used in the field is available for a buffer layer. Preferred materials for the buffer layer include, but are not limited to, copper phthalocyanine, polythiophene, polyaniline, polyacetylene, polypyrrole, polyphenylene vinylene, and derivatives of the forgoing materials. Any material commonly used in the field is available for a hole transporting layer. A non-limiting, preferred material for the hole transporting layer is polytriphenylamine. Any material commonly used in the field is available for an electron transporting layer. A non-limiting, preferred material for the electron transporting layer is polyoxadiazole. Any material commonly used in the field is available for a hole blocking layer. Preferred materials for the hole blocking layer include, but are not limited to, LiF, $BaF_2$, and $MgF_2$.

The organo-EL device according to the present invention may be manufactured using conventional apparatuses and methods.

The present invention will be described in greater detail with reference to the following examples. The following examples are for illustrative purposes and are not intended to limit the scope of the invention.

PREPARATION EXAMPLE 1

Preparation of a Phenoxazine Monomer (Compound (C) of FIG. 1A)

1) Preparation of Compound (A)

48.4 g (0.35 mmol) of $K_2CO_3$ was added to a solution of 50 g (0.29 mmol) of 4-bromophenol in 500 mL of acetone, and 73.3 g (0.38 mmol) of 1-bromooctane was added to the mixture and refluxed for 24 hours.

After the reaction was completed, the reaction mixture was extracted using a 2:1 mixture of water and $CHCl_3$ by volume to remove $K_2CO_3$. The organic layers were dried using $MgSO_4$, concentrated, and subjected to silica gel column chromatography using hexane as an eluent. A resulting eluate was distilled under reduced pressure to remove unreacted 1-bromooctane and provided 80 g of Compound (A) of FIG. 1A with a yield of 96%. The structure of Compound (A) was identified through $^1$H-NMR.

2) Preparation of Compound (B)

18 g (64 mmol) of Compound (A), 10 g (54 mmol) of phenoxazine, 7.4 g (77 mmol) of sodium tert-butoxide, 0.61 g (1.1 mmol) of $Pd_2(dba)_3$ {Tris(dibenzylidene acetone) dipalladium(0)}, and 0.22 g (1.1 mmol) of tri(tert-butyl) phosphine were dissolved in 250 mL of xylene and reacted at 80° C. for 12 hours.

After the reaction was completed, the reaction mixture was cooled to room temperature, and 200 mL of distilled water was added to quench the reaction mixture. The reaction mixture was extracted using a 1:1 mixture of xylene and water by volume. The organic layers were dried using $MgSO_4$, concentrated, and subjected to silica gel column chromatography using a 1:2 mixture of toluene and hexane by volume as an eluent. A resulting eluate was concentrated and dried to provide 18.5 g of Compound (B) of FIG. 1A with a yield of 88%. The structure of Compound (B) was identified through $^1$H-NMR.

3) Preparation of Compound (C)

2.1 equivalents of bromine was slowly added to a solution of 5 g (13 mmol) of Compound (B) in 150 ml of $CHCl_3$ with the control of temperature at 0° C. When the complete consumption of the starting material was confirmed through thin layer chromatography (TLC), addition of bromine was stopped, and the reaction mixture was stirred for 10 min.

Next, a small amount of acetone was added to the reaction mixture to quench bromine, followed by extraction using a 2:1 mixture of water and $CHCl_3$ by volume. The organic layers were dried using $MgSO_4$, concentrated, and reprecipitated in methanol to provide 6 g of Compound (C) with a yield of 85%. The structure of Compound (C) was identified through $^1$H-NMR as follows: $^1$H-NMR (300 MHz, $CDCl_3$): δ0.91(m, 6H), δ1.45(m, 8H), δ1.82(m, 1H) δ3.89 (d, 2H), δ5.82(d, 2H), δ6.5~7.5(m, 8H).

PREPARATION EXAMPLE 2

Preparation of 9,9-dioctyl-2,7-dibromofluorene monomer (Compound (D) of FIG. 1A)

1.25 g (3.85 mmol) of tetrabutyl ammonium bromide (TBAB) was added to a solution of 25 g (77 mmol) of 2,7-dibromofluorene and 36 g (185 mmol) of n-octylbromide in 100 mL of toluene, and a solution of 31 g (770 mmol) of NaOH in 50 mL of water was added and refluxed for 2 days.

After the reaction was completed, the reaction mixture was extracted with a 2:1 mixture water and $CHCl_3$ by volume. The organic layers were dried using $MgSO_4$, concentrated, and subjected to silica gel column chromatography using n-hexane as an eluent. A resulting eluate was distilled under reduced pressure to remove unreacted n-octylbromide and provide 40 g of Compound (D) with a yield of 95%. The structure of Compound (D) was identified through $^1$H-NMR as follows: $^1$H-NMR (300 MHz, $CDCl_3$): δ0.65(broad s, 4H), δ0.87(m, 6H), δ1.21(m, 20H), δ1.93(m, 4H), δ7.48(m, 4H), δ7.54(m, 2H).

PREPARATION EXAMPLE 3

Preparation of 2,7-dibromo-2',3',6',7'-dioctyloxyspirofluorene (Compound (G) of FIG. 1B)

1) Preparation of Compound (F)

8.45 g (11 mmol) of Compound (E) in 50 mL of ether was added to a solution of 3.36 g (10 mmol) of 2,7-dibromo-9-fluorenone in 50 mL, and stirred at reflux overnight.

After the reaction was completed, the reaction product was cooled, filtered to give yellow powder, and washed three times. Ammonium chloride was added to the product, stirred for 10 hours, and filtered. The filter cake was washed with water three times, followed by recrystallization in ethanol to provide a yellow solid Compound (F) with a yield of 83%.

2) Preparation of Compound (G)

5.0 g (5 mmol) of Compound (F) was added to 15 mL of $CH_3COOH$ and gently stirred at reflux, and 0.5 mL of hydrochloric acid was added to the reaction mixture and refluxed for 1 hour. After the reaction was completed, the reaction product was cooled to room temperature and filtered. The filter cake was washed with water three times, followed by recrystallization in ethanol to provide 1.42 g (1.44 mmol) of a white powdery Compound (G) with a yield of 29%. The structure of Compound (G) was identified through $^1$H-NMR as follows: $^1$H-NMR (300 MHz, $CDCl_3$): $\delta$7.60(d, 2H), $\delta$7.43(dd, 2H), $\delta$7.16(d, 2H), $\delta$6.79(s, 2H), $\delta$6.20(s, 2H), $\delta$4.18(m, 4H), $\delta$3.75(m, 4H), $\delta$1.94(m, 8H), $\delta$1.72(m, 8H), $\delta$1.30(m, 32H), $\delta$0.96(m, 12H).

EXAMPLE 1

Preparation of poly(dioctylfluorene-co-phenoxazine) Represented by Formula 4 in a Mole Ratio of 90:10 of Formula (4) of FIG. 1A A Schlenk flask was fully evacuated and refluxed with nitrogen gas to completely remove moisture. 880 mg (3.2 mmol) of bis(1,5-cyclooctadiene) nickel(0) {Ni(COD)$_2$} and 500 mg (3.2 mmol) of bipyridal were charged into the Schlenk flask in a glove box. Next, the flask was fully evacuated again and refluxed with nitrogen gas. 10 mL of anhydrous dimethyl formamide (DMF), 346 mg (3.2 mmol) of 1,5-cyclooctadiene (COD), and 10 mL of anhydrous toluene were added to the flask under nitrogen atmosphere. The reaction mixture was stirred at 80° C. for 30 min, a diluted solution of 87 mg (0.16 mmol) of Compound (C) prepared in Preparation Example 1 and 790 mg (1.44 mmol) of Compound (D), i.e., 9,9-dioctyl-2,7-dibromofluorene, prepared in Preparation Example 2 in 10 mL of toluene was added. Next, 10 mL of toluene was added to the flask such that adhering materials on the flask wall were fully incorporated into the solution and stirred at 80° C. for 4 days. Next, 1 mL of bromopentafluorobenzene was added to the mixture and stirred at 80° C. for 1 day.

After the reaction was completed, the temperature of the reaction mixture was dropped to 60° C., and the reaction mixture was poured into a 1:1:2 mixture of HCl, acetone, and methanol by volume to precipitate. The precipitates were dissolved in chloroform, reprecipitated in methanol, and subjected to Soxhlet extraction to give 490 mg of poly(dioctylfluorene-cophenoxazine in a mole ratio of 90:10 with a yield of 75%. As a result of gel permeation chromatography (GPC), the weight average molecular weight (Mw) was 96,000, and the molecular weight distribution (MWD) was 2.63.

EXAMPLE 2

Preparation of poly(dioctylfluorene-co-phenoxazine) Represented by Formula 4 in a Mole Ratio of 80:20 of FIG. 1A A Schlenk flask was fully evacuated and refluxed with nitrogen gas to completely remove moisture. 880 mg (3.2 mmol) of Ni(COD)$_2$ and 500 mg (3.2 mmol) of bipyridyl were charged into the Schlenk flask in a glove box. The flask was evacuated again and refluxed with nitrogen gas. 10 mL of anhydrous DMF, 346 mg (3.2 mmol) of COD, and 10 mL of anhydrous toluene were added to the flask under nitrogen atmosphere. The reaction mixture was stirred at 80° C. for 30 min, and a diluted solution of 174 mg (0.32 mmol) of Compound (C) prepared in Preparation Example 1 and 700 mg (1.28 mmol) of Compound (D) prepared in Preparation Example 2, i.e., 9,9'-dioctyl-2,7-dibromofluuorene, in 10 mL of toluene was added to the mixture. Next, 10 mL of toluene was added to the flask such that adhering materials on the flask wall were fully incorporated into the solution. The mixture was stirred at 80° C. for 4 days, and 1 mL of bromopentafluorobenzene was added to the mixture and stirred at 80° C. for 1 day.

After the reaction was completed, the temperature of the reaction mixture was dropped to 60° C., and the reaction mixture was poured into a 1:1:2 mixture of HCl, acetone, and methanol by volume to precipitate. The precipitates were dissolved in chloroform, reprecipitated in methanol, and subjected to Soxhlet extraction to give 420 mg of poly(dioctylfluorene-cophenoxazine in a mole ratio of 80:20 with a yield of 70%. As a result of gel permeation chromatography (GPC), the weight average molecular weight (Mw) was 40,000, and the molecular weight distribution (MWD) was 2.23.

EXAMPLE 3

Preparation of poly(2',3',6',7'-tetraoctyloxyspirofluorene-co-phenoxazine) Represented by Formula 5 in a Mole Ratio of 90:10 of FIG. 1B A Schlenk flask was fully evacuated and refluxed with nitrogen gas to completely remove moisture. 880 mg (3.2 mmol) of Ni(COD)$_2$ and 500 mg (3.2 mmol) of bipyridyl were charged into the Schlenk flask in a glove box. The flask was evacuated again and refluxed with nitrogen gas. 10 mL of anhydrous DMF, 346 mg (3.2 mmol) of COD, and 10 mL of anhydrous toluene were added to the flask under nitrogen atmosphere. The reaction mixture was stirred at 80° C. for 30 min, and a diluted solution of 87 mg (0.16 mmol) of Compound (C) prepared in Preparation Example 1 and 1.42 g (1.44 mmol) of Compound (G) prepared in Preparation Example 3, i.e., 2,7-dibromo-2',3',6',7'-dioctylspirofluorene, in 10 mL of toluene was added to the mixture. Next, 10 mL of toluene was added to the flask such that adhering materials on the flask wall were fully incorporated into the solution. The mixture was stirred at 80° C. for 4 days, and 1 mL of bromopentafluorobenzene was added to the mixture and stirred at 80° C. for 1 day.

After the reaction was completed, the temperature of the reaction mixture was dropped to 60° C., and the reaction mixture was poured into a 1:1:2 mixture of HCl, acetone, and methanol by volume to precipitate. The precipitates were dissolved in chloroform, reprecipitated in methanol, and subjected to Soxhlet extraction to give 620 mg of poly(2',3',6',7'tetraoctyloxyspirofluorene-co-phenoxazine in a mole ratio of 90:10 with a yield of 80%. As a result of gel permeation chromatography (GPC), the weight average molecular weight (Mw) was 198,000, and the molecular weight distribution (MWD) was 2.07.

COMPARATIVE EXAMPLE 1

Preparation of poly(9,9-dioctyl-2,7-fluorene)

A Schlenk flask was fully evacuated and refluxed with nitrogen gas to completely remove moisture. 880 mg (3.2 mmol) of Ni(COD)$_2$ and 500 mg (3.2 mmol) of bipyridyl were charged into the Schlenk flask in a glove box. Next, the flask was evacuated again and refluxed with nitrogen gas. 10 mL of anhydrous DMF, 346 mg (3.2 mmol) of COD, and 10 mL of anhydrous toluene were added to the flask under nitrogen atmosphere. The reaction mixture was stirred at 80° C. for 30 min, and a diluted solution of 1.03 g (1.28 mmol) of 9,9-dioctyl-2,7-dibromofluorene prepared in Preparation Example 2 in 10 mL of toluene was added to the mixture. Next, 10 mL of toluene was added to the mixture such that adhering materials on the flask wall were fully incorporated into the solution. The mixture was stirred at 80° C. for 4 days, and 1 mL of bromopentafluorobenzene was added to the mixture and stirred at 80° C. for 1 day.

After the reaction was completed, the temperature of the reaction mixture was dropped to 60° C., and the reaction mixture was poured into a 1:1:2 mixture of HCl, acetone, and methanol by volume and stirred for 12 hours to precipitate. The precipitates were recovered through a gravity filter, dissolved in a small amount of chloroform, and reprecipitated in methanol. The precipitates were recovered again through the gravity filter and subjected to Soxhlet extraction using methanol and chloroform, to give 450 mg of poly(9,9-dioctyl-2,7-fluorene) with a yield of 60%. As a result of gel permeation chromatography (GPC), the weight average molecular weight (Mw) was 100,000, and the molecular weight distribution (MWD) was 2.64.

EXAMPLE 4

Manufacture of an EL Device

A top surface of a glass substrate 6 was coated with indium-tin oxide (ITO) to form a transparent electrode (ITO) layer (cathode) 5 and clearly washed. The ITO layer 5 was patterned into a desired shape using a photoresist rein and etchant and washed. BATRON P 4083 (available from BAYER CO.) was coated on the patterned ITO layer 5 to a thickness of 800 Å to form a conductive buffer layer 4 and baked at 180° C. for about 1 hour. 0.05 g of PFPO91 prepared in Preparation Example 1 was dissolved in 5 g of toluene to obtain an EL polymer solution. The EL polymer solution was spin coated on the buffer layer 4, backed, and placed in a vacuum oven to fully remove the solvent and form an emissive layer 3. Prior to the spin coating, the EL polymer solution was filtered through a 0.2 mm filter. The concentration of EL polymer solution and the spinning rate were controlled to form an emissive layer 3 having a thickness of about 80 nm.

Next, calcium and aluminum were sequentially deposited to form an anode 2 on the emissive layer 3 in a vacuum deposition chamber at a vacuum of $4\times10^{-6}$ torr to manufacture an EL device 1. The thickness and growth rate of layers during the deposition were controlled using a crystal sensor.

Figure 3:
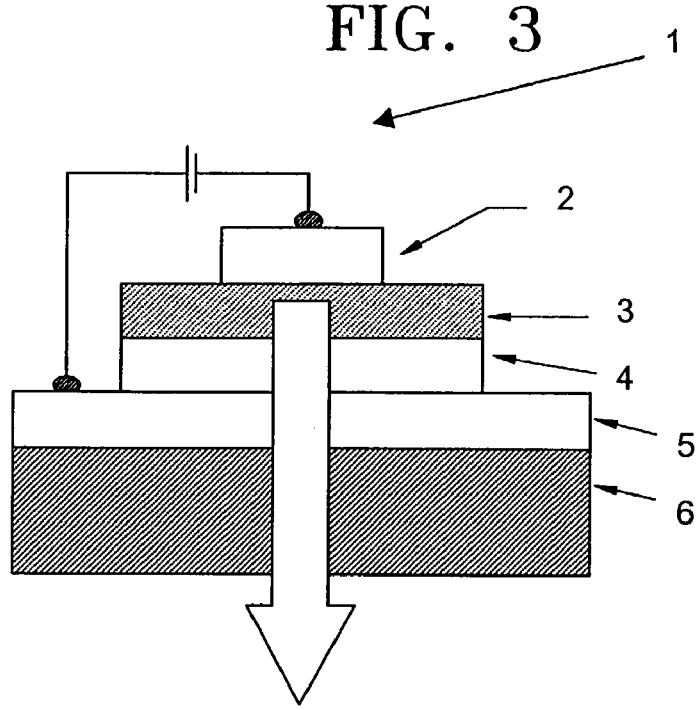
FIG. 3 is a sectional view illustrating the structure of an electroluminescent (EL) device manufactured in Example 4 according to the present invention.

The resulting EL device 1 had a single stack structure in which ITO 5, PEDOT {poly( 3,4-ethylenedioxythiophene) }/PSS(polystyrene parasulfonate), the blue EL polymer, Ca, and Al were sequentially stacked upon one another, as illustrated in FIG. 3. The emissive area was 2 mm$^2$.

EXAMPLES 5 AND 6

Manufacture of EL Devices

EL devices were manufactured in the same manner as in Example 4, except that 0.05 g of PFPO82 of Preparation Example 2 and 0.05 g of TS9 of Preparation Example 3 were used, respectively, instead of 0.05 g of PFPO91 of Preparation Example 1, to prepare EL polymer solutions.

COMPARATIVE EXAMPLE 2

Manufacture of an EL Device

An EL device was manufactured in the same manner as in Example 4, except that 0.05 g of poly(9,9'-dioctyl-2,7-fluorene) (DF) of Comparative Example 1 was used, instead of 0.05 g of PFPO91 of Preparation Example 1, to prepare the EL polymer solution.

The EL properties were measured using the EL devices of Examples 4–6 and Comparative Example 2. For this measurement, a forward bias voltage was applied as a direct current (DC) driving voltage. The results are shown in Table 1 below.

TABLE 1

| Example | Example 4 | Example 5 | Example 6 | Comparative Example 2 |
|---|---|---|---|---|
| Emissive polymer | PFPO91 | PFPO82 | TS9 | DF |
| Maximum emission wavelength (color) | 460 nm (blue) | 467 nm (blue) | 480 nm (blue) | 470 nm (blue) |
| Maximum luminance (cd/m$^2$) | 11,000 | 6,700 | 12,000 | 1,200 |
| Maximum efficiency (cd/A) | 1.5 | 1.0 | 3.6 | 0.25 |
| Driving voltage (V) | 4.0 | 4.0 | 4.8 | 5.5 |
| Half-lifetime (hr) (at 100 cd/m$^2$) | 142 | 36 | 2000 | 0.5 |

Figure 4:
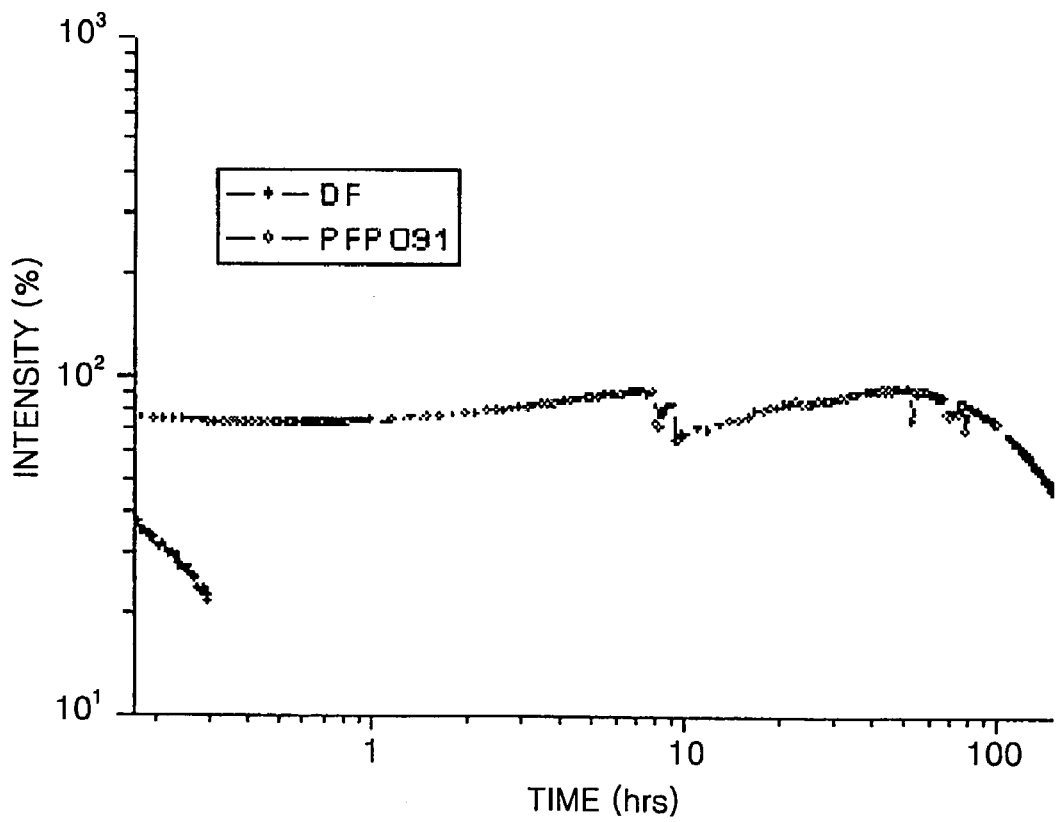
FIG. 4 is a graph of EL intensity versus time for EL devices manufactured in Example 4 according to the present invention and Comparative Example 2.
Figure 5:
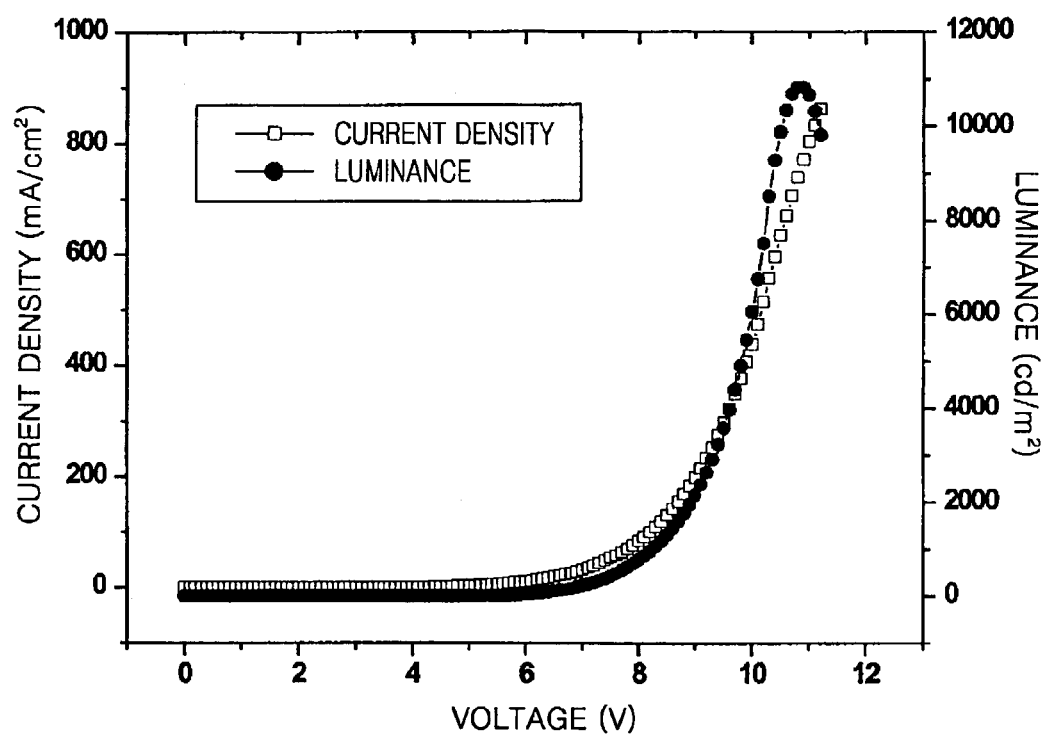
FIG. 5 is a graph of current density and luminance versus voltage for the EL device manufactured in Example 4 according to the present invention.

As a result of the EL property measurement, all of the EL devices manufactured in Examples 4 through 6 and Comparative Example 2 exhibit A typical rectifying diode's characteristics. Particularly, the EL devices of Examples 4 through 6, including the polymers according to the present invention, show stable voltage-current density properties that stay at the initial levels even after several times of repeated operations. EL intensity variation versus time and variations in current density and luminance versus time were measured using the EL device of Example 4. The results are shown in FIGS. 4 and 5, respectively.

As described above, a blue EL polymer according to an embodiment of the present invention shows strong and stable emissive properties. In addition, when the blue EL polymer according to the present invention is used for organic layers, in particular, an emissive layer, of an EL device, the luminance and efficiency of the organic-EL device are improved.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A blue electroluminescent polymer of formula (1) below:

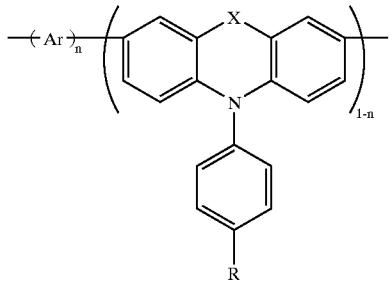

(1)

where:
- Ar is a $C_{6-26}$ aromatic group or a $C_{4-20}$ heteroaromatic group including at least one heteroatom in the aromatic ring, where the aromatic group or the heteroaromatic group is unsubstituted or substituted with at least one of a $C_{1-12}$ alkyl group, a $C_{1-12}$ alkoxy group, and —N(R')(R") where R' and R" are independently a hydrogen atom or a $C_{1-12}$ alkyl group;
- X is one of O, $CH_2$, and S;
- R is selected from the group consisting of a hydrogen atom, a $C_{1-12}$ linear alkyl group, a $C_{1-12}$ branched alkyl group, a $C_{1-12}$ alkoxy group, a cyclic $C_{3-12}$ alkyl group, and a $C_{6-14}$ aromatic group which is unsubstituted or substituted with at least one of a $C_{1-12}$ alkyl group, a $C_{1-12}$ alkoxy group, and —N(R')(R") where R' and R" are independently a hydrogen atom or a $C_{1-12}$ alkyl group; and
- n is a real number ranging from at or between 0.01 and 0.99.

2. The blue electroluminescent polymer of claim 1, wherein the Ar as a repeating unit has a structure selected from the groups of formula (2) and (3) below:

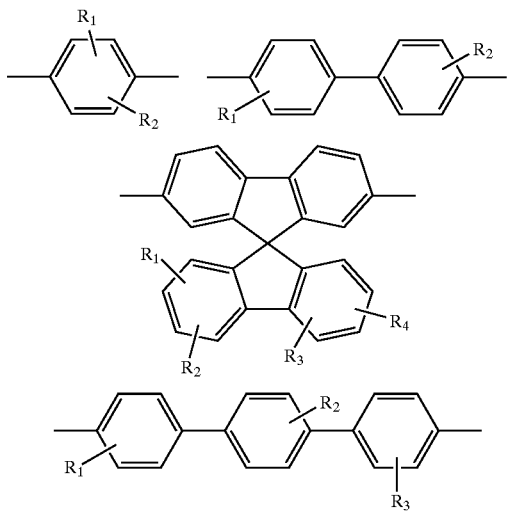

(2)

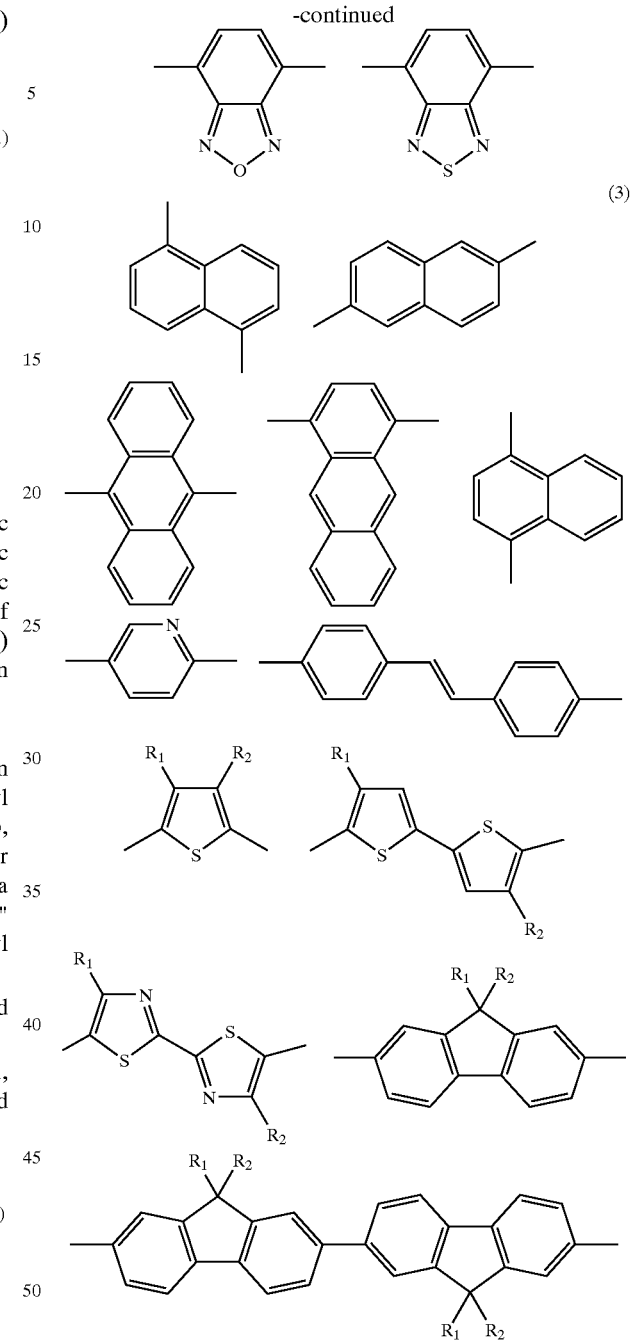

where $R_1$, $R_2$, $R_3$, and $R_4$ are independently selected from a group consisting of a $C_{1-12}$ alkyl group, a $C_{1-12}$ alkoxy group, and —N(R')(R") where R' and R" are independently a hydrogen atom or a $C_{1-12}$ alkyl group.

3. The blue electroluminescent polymer of claim 2, wherein the Ar unit in the formula (1) is alkylfluorene.

4. The blue electroluminescent polymer of claim 1, wherein the blue electroluminescent polymer has a weight average molecular weight of 10,000–200,000 and a molecular weight distribution of 1.5–5.

5. The blue electroluminescent polymer of claim 1, having formula (4) below:

(4)

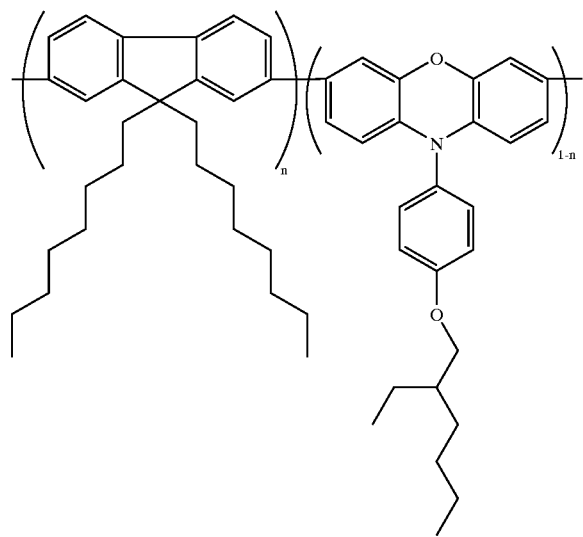

where n is a real number ranging from 0.01 to 0.99.

6. The blue electroluminescent polymer of claim 1, having formula (5) below:

(5)

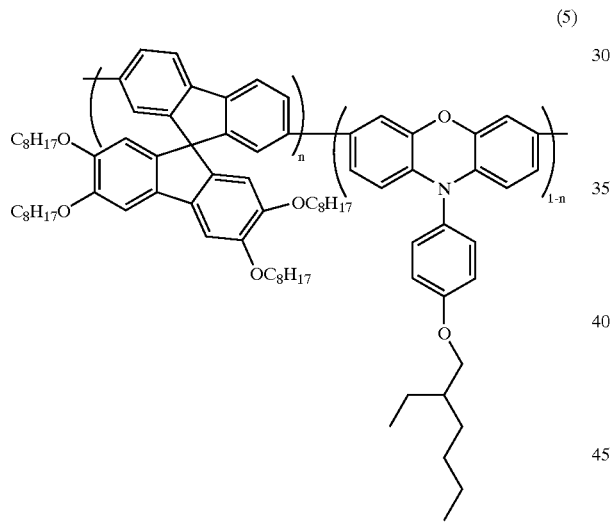

where n is a real number ranging from 0.01 to 0.99.

7. An organo-electroluminescent device comprising a pair of electrodes and an organic layer between the pair of electrodes, the organic layer comprising blue electroluminescent polymer of formula (1) below:

(1)

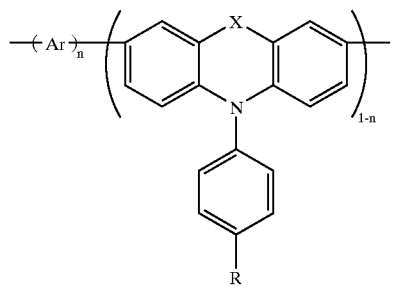

where:
Ar is a $C_{6-26}$ aromatic group or a $C_{4-20}$ heteroaromatic group including at least one heteroatom in the aromatic ring, where the aromatic group or the heteroaromatic group is unsubstituted or substituted with at least one of a $C_{1-12}$ alkyl group, a $C_{1-12}$ alkyl group, a $C_{1-12}$ alkoxy group, and —N(R')(R") where R' and R" are independently a hydrogen atom or a $C_{1-12}$ alkyl group;

X is one of O, $CH_2$, and S;

R is selected from a group consisting of a hydrogen atom, a $C_{1-12}$ linear alkyl group, a $C_{1-12}$ branched alkyl group, a $C_{1-12}$ alkoxy group, a cyclic $C_{3-12}$ alkyl group, and a $C_{6-14}$ aromatic group which is unsubstituted or substituted with at least one of a $C_{1-12}$ alkyl group, a $C_{1-12}$ alkoxy group, and —N(R')(R") where R' and R" are independently a hydrogen atom or a $C_{1-12}$ alkyl group; and n is a real number ranging from at or between 0.01 and 0.99.

8. The organo-electroluminescent device of claim 7, wherein the organic layer is an emissive layer.

9. The organo-electroluminescent device of claim 7, wherein the Ar as a repeating unit has a structure selected from the groups of formula (2) and (3) below:

(2)

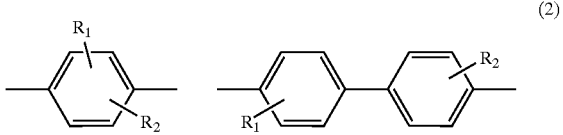

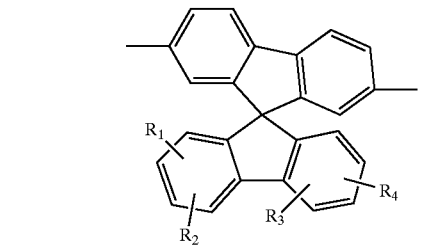

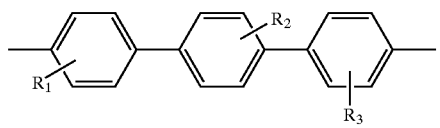

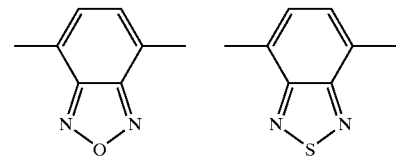

(3)

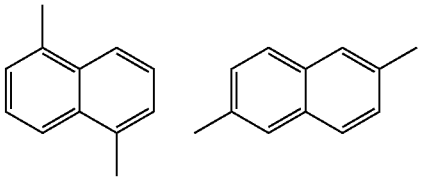

-continued

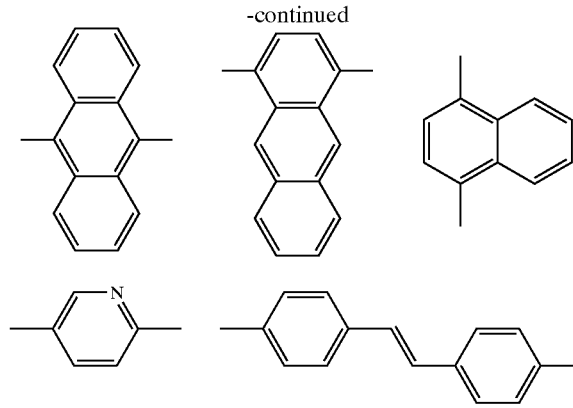

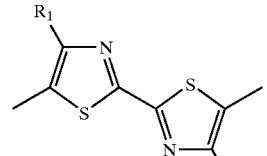

where $R_1$, $R_2$, $R_3$, and $R_4$ are independently selected from a group consisting of a $C_{1-12}$ alkyl group, a $C_{1-12}$ alkoxy group, and —N(R')(R") where R' and R" are independently a hydrogen atom or a $C_{1-12}$ alkyl group.

10. The organo-electroluminescent device of claim 9, wherein the Ar unit in the formula (1) is alkylfluorene.

11. The organo-electroluminescent device of claim 7, wherein the blue electroluminescent polymer has a weight average molecular weight of 10,000–200,000 and a molecular weight distribution of 1.5–5.

12. The blue electroluminescent polymer of claim 7, having formula (4) below:

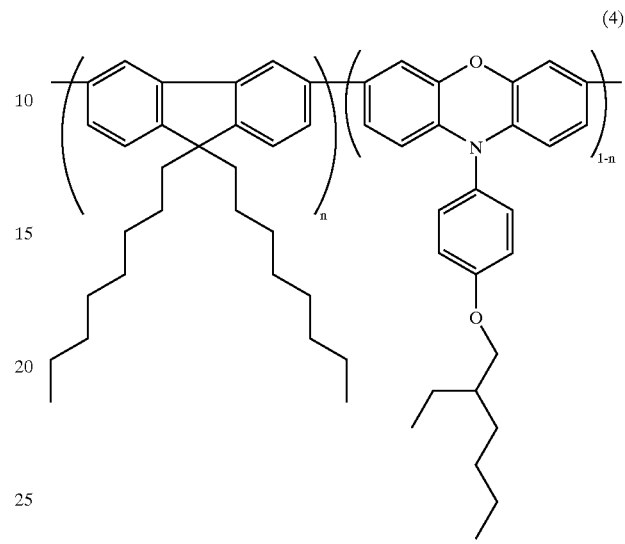

where n is real number ranging from 0.01 to 0.99.

13. The organo-electroluminescent device of claim 7, having formula (5) below:

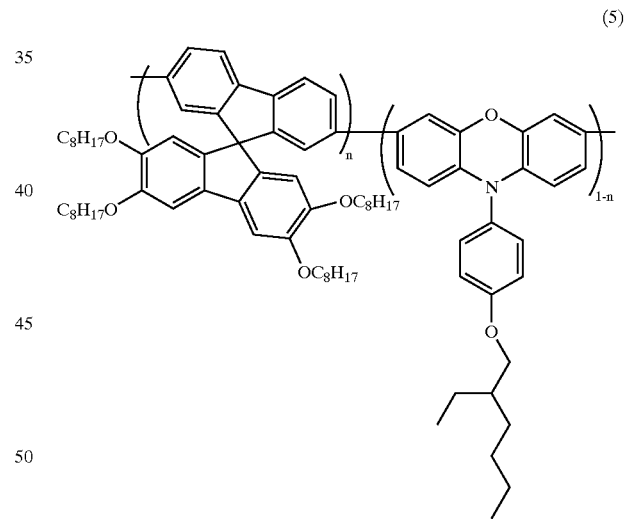

where n is a real number ranging from 0.01 to 0.99.

* * * * *

UNITED STATES PATENT AND TRADEMARK OFFICE
CERTIFICATE OF CORRECTION

PATENT NO. : 6,984,461 B2  
DATED : January 10, 2006  
INVENTOR(S) : Jhun-mo Son et al.

It is certified that error appears in the above-identified patent and that said Letters Patent is hereby corrected as shown below:

Title page,
Item [75], Inventors, change "Woo-jung Beek" to -- Woon-jung Baek --.

Signed and Sealed this

Twenty-eighth Day of March, 2006

JON W. DUDAS  
*Director of the United States Patent and Trademark Office*